US010128088B2

United States Patent
Kulshreshtha et al.

(10) Patent No.: US 10,128,088 B2
(45) Date of Patent: Nov. 13, 2018

(54) GRADED IN-SITU CHARGE TRAPPING LAYERS TO ENABLE ELECTROSTATIC CHUCKING AND EXCELLENT PARTICLE PERFORMANCE FOR BORON-DOPED CARBON FILMS

(71) Applicant: Applied Materials, Inc., Santa Clara, CA (US)

(72) Inventors: Prashant Kumar Kulshreshtha, San Jose, CA (US); Ziqing Duan, Sunnyvale, CA (US); Abdul Aziz Khaja, San Jose, CA (US); Zheng John Ye, Santa Clara, CA (US); Amit Kumar Bansal, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 348 days.

(21) Appl. No.: 15/166,328

(22) Filed: May 27, 2016

(65) Prior Publication Data
US 2016/0358804 A1    Dec. 8, 2016

Related U.S. Application Data

(60) Provisional application No. 62/190,120, filed on Jul. 8, 2015, provisional application No. 62/171,751, filed on Jun. 5, 2015.

(51) Int. Cl.
*H01L 21/683* (2006.01)
*H01J 37/32* (2006.01)
(Continued)

(52) U.S. Cl.
CPC ...... *H01J 37/32477* (2013.01); *C23C 16/029* (2013.01); *C23C 16/0272* (2013.01);
(Continued)

(58) Field of Classification Search
USPC .......................................................... 361/234
See application file for complete search history.

(56) References Cited

U.S. PATENT DOCUMENTS 5,928,771 A * 7/1999 DeWald, Jr. ........ C23C 14/0073
428/216
6,150,239 A * 11/2000 Goesele ............ H01L 21/76251
117/915

(Continued)

FOREIGN PATENT DOCUMENTS

WO    2008027845 A2    3/2008
WO    2011005433 A2    1/2011

OTHER PUBLICATIONS

International Search Report and Written Opinion dated Jul. 29, 2016 for Application No. PCT/US2016/032713.

*Primary Examiner* — Ronald W Leja
(74) *Attorney, Agent, or Firm* — Patterson + Sheridan LLP (57) ABSTRACT

The present disclosure generally relates to processing chamber seasoning layers having a graded composition. In one example, the seasoning layer is a boron-carbon-nitride (BCN) film. The BCN film may have a greater composition of boron at the base of the film. As the BCN film is deposited, the boron concentration may approach zero, while the relative carbon and nitrogen concentration increases. The BCN film may be deposited by initially co-flowing a boron precursor, a carbon precursor, and a nitrogen precursor. After a first period of time, the flow rate of the boron precursor may be reduced. As the flow rate of boron precursor is reduced, RF power may be applied to generate a plasma during deposition of the seasoning layer.

20 Claims, 9 Drawing Sheets

(51) Int. Cl.
  *C23C 16/458* (2006.01)
  *C23C 16/02* (2006.01)
  *C23C 16/34* (2006.01)
  *C23C 16/36* (2006.01)
  *C23C 16/44* (2006.01)
  *C23C 16/509* (2006.01)

(52) U.S. Cl.
  CPC ............ *C23C 16/347* (2013.01); *C23C 16/36* (2013.01); *C23C 16/4404* (2013.01); *C23C 16/4586* (2013.01); *C23C 16/5096* (2013.01); *H01J 37/32082* (2013.01); *H01L 21/6831* (2013.01)

(56) References Cited

U.S. PATENT DOCUMENTS

| | | | |
|---|---|---|---|
| 6,377,437 B1 | 4/2002 | Sexton et al. | |
| 8,084,105 B2* | 12/2011 | Huh | C23C 16/45523 427/376.6 |
| 9,330,903 B2* | 5/2016 | Sano | H01L 21/022 |
| 2001/0034089 A1* | 10/2001 | Yamazaki | H01L 27/127 438/166 |
| 2002/0182394 A1* | 12/2002 | Sane | C04B 35/583 428/216 |
| 2004/0241964 A1 | 12/2004 | Sugino et al. | |
| 2010/0098884 A1* | 4/2010 | Balseanu | C23C 16/0272 427/577 |
| 2012/0034761 A1* | 2/2012 | Kuppurao | H01L 21/02046 438/476 |
| 2014/0272184 A1 | 9/2014 | Sreekala et al. | |
| 2015/0287588 A1* | 10/2015 | Sano | C23C 16/36 438/763 |
| 2015/0287591 A1* | 10/2015 | Pore | C23C 16/45531 438/778 |
| 2016/0358804 A1* | 12/2016 | Kulshreshtha | C23C 16/4586 |

* cited by examiner

GRADED IN-SITU CHARGE TRAPPING LAYERS TO ENABLE ELECTROSTATIC CHUCKING AND EXCELLENT PARTICLE PERFORMANCE FOR BORON-DOPED CARBON FILMS

CROSS-REFERENCE TO RELATED APPLICATIONS

This application claims benefit of U.S. Provisional Patent Application Ser. No. 62/171,751, filed Jun. 5, 2015, and U.S. Provisional Patent Application Ser. No. 62/190,120, filed Jul. 8, 2015, which are herein incorporated by reference.

BACKGROUND

Field

Embodiments of the disclosure generally relate to seasoning films for process chambers, such as semiconductor process chambers, and methods of applying and using the same.

Description of the Related Art

One aspect for next generation devices is to achieve higher throughput and better device yield and performance from each silicon substrate processed. Future generations of NAND and DRAM device have increasing multi-stacks of oxynitride depositions which results in incoming substrates with a bow of greater than±200 um. Without sufficient clamping force to flatten substrates during film deposition, it becomes difficult to achieve uniformity in film properties such as bevel coverage, thickness, and etch selectivity.

It is possible to remove the bow from substrates via electrostatic chucking, which improves film property uniformity. However, the electrostatic chucking of substrates is often affected by seasoning layers applied within a processing chamber to protect processing chamber components. One example of a seasoning film is boron-containing carbon films. While the boron-containing carbon films facilitate electrostatic chucking, the boron-containing carbon films flake easily and result in particle contamination on substrates. Another example of a seasoning layer is amorphous boron films. Amorphous boron films have decreased flaking as compared to boron-containing carbon films. However, the amorphous boron films have relatively high leakage currents and therefore negatively affect the electrostatic chucking of bowed substrates.

Therefore, there is a need for an improved processing chamber seasoning layer which provides adequate particle and chucking performance.

SUMMARY

The present disclosure generally relates to processing chamber seasoning layers having a graded composition. In one example, the seasoning layer is a boron-carbon-nitride (BCN) film. The BCN film may have a greater composition of boron at the base of the film. As the BCN film is deposited, the boron concentration may approach zero, while the relative carbon and nitrogen concentration increases. The BCN film may be deposited by initially coflowing a boron precursor, a carbon precursor, and a nitrogen precursor. After a first period of time, the flow rate of the boron precursor may be tapered to zero. As the flow rate of boron precursor is reduced, RF power may be applied to generate a plasma region during deposition of the seasoning layer.

In one embodiment, a method of depositing a seasoning layer comprises introducing a boron precursor, a nitrogen precursor, and a carbon precursor into a processing chamber for a first time period. An amorphous boron base portion of a boron-carbon-nitrogen seasoning layer is formed during the first time period. The flow rate of the boron precursor is tapered during a second time period. A top portion of the boron-carbon-nitrogen seasoning layer is deposited on the base portion during the second time period. The top portion has a tapered boron concentration profile.

In another embodiment, a method of chucking a substrate comprises forming a seasoning layer within a process chamber. Forming the seasoning layer comprises introducing a boron precursor, a nitrogen precursor, and a carbon precursor into a processing chamber for a first time period. An amorphous boron base portion of a boron-carbon-nitrogen seasoning layer is formed during the first time period. The flow rate of the boron precursor is tapered during a second time period. A top portion of the boron-carbon-nitrogen seasoning layer is deposited on the base portion during the second time period. The top portion has a tapered boron concentration profile. A substrate is positioned on a support including an electrostatic chuck within the processing chamber, and power is applied to the support to electrostatically chuck the substrate to the support.

In another embodiment, a seasoning layer comprises a boron-carbon-nitrogen film, wherein the boron-carbon-nitrogen film has a base portion with a uniform boron concentration, and a top portion with a tapered boron concentration.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

7B illustrates a substrate processed in a processing chamber seasoned with a seasoning layer of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to processing chamber seasoning layers having a graded composition. In one example, the seasoning layer is a boron-carbon-nitride (BCN) film. The BCN film may have a greater composition of boron at the base of the film. As the BCN film is deposited, the boron concentration may approach zero, while the relative carbon and nitrogen concentration increases. The BCN film may be deposited by initially co-flowing a boron precursor, a carbon precursor, and a nitrogen precursor. After a first period of time, the flow rate of the boron precursor may be tapered to zero. As the flow rate of boron precursor is reduced, RF power may be applied to generate a plasma region during deposition of the seasoning layer.

Figure 1A:
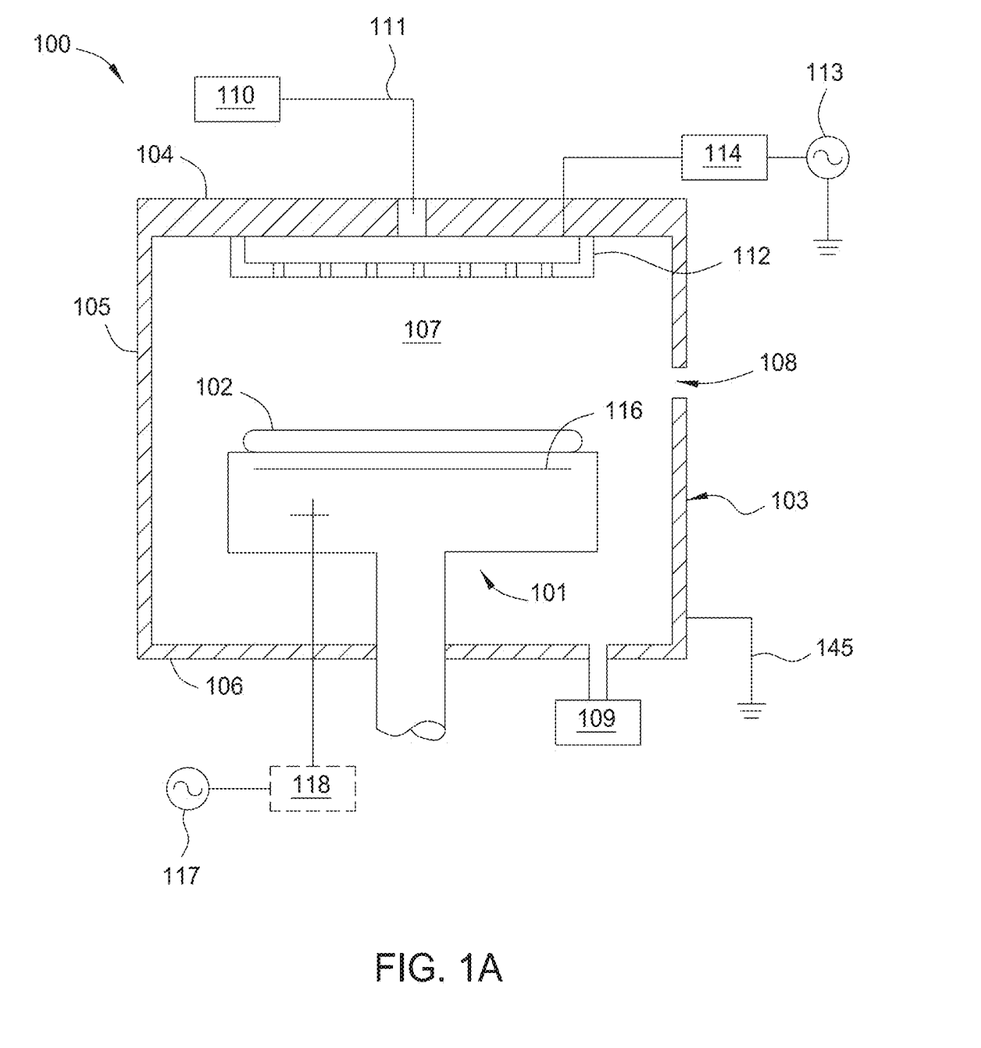
FIG. 1A is a schematic view of a processing chamber in which a seasoning layer of the present disclosure may be deposited.

FIG. 1A is a schematic sectional view of a processing chamber 100 in which a seasoning layer of the present disclosure may be deposited. The processing chamber 100 includes a substrate support assembly 101 on which a substrate 102 is processed. The processing chamber 100 may be a chemical vapor deposition (CVD) processing chamber, a hot wire chemical vapor deposition (HWCVD) processing chamber, an etch chamber, or another vacuum chamber for processing substrates.

The processing chamber 100 includes a chamber body 103 having a top 104, chamber sidewalls 105, and a chamber bottom 106 which are coupled to a ground 145. The top 104, the chamber sidewalls 105, and the chamber bottom 106 define an interior processing region 107. The chamber sidewalls 105 may include a substrate transfer port 108 to facilitate transferring the substrate 102 into and out of the processing chamber 100. The substrate transfer port 108 may be coupled to a transfer chamber and/or other chambers of a substrate processing system.

The dimensions of the chamber body 103 and related components of the processing chamber 100 are not limited and generally are proportionally larger than the size of the substrate 102 to be processed therein. Examples of substrate sizes include 200 mm diameter, 250 mm diameter, 300 mm diameter and 450 mm diameter, among others.

In one embodiment, a pumping device 109 is coupled to the bottom 106 of the processing chamber 100 to evacuate and control the pressure with the processing chamber 100. The pumping device 109 may be a conventional roughing pump, roots blower, turbo pump or other similar device that is adapted to control the pressure in the interior processing region 107. In one example, the pressure level of the interior processing region 107 of the processing chamber 100 may be maintained at less than about 760 Torr.

A gas panel 110 supplies process, precursor gases, and other gases through a gas line 111 into the interior processing region 107 of the chamber body 103. The gas panel 110 may be configured to provide one or more process gas sources, cleaning gases, inert gases, non-reactive gases, and reactive gases, if desired. A showerhead 112 is disposed below the top 104 of the processing chamber 100 and is spaced above the substrate support assembly 101. As such, the showerhead 112 is above the substrate 102 when the substrate 102 is positioned on the substrate support assembly 101 for processing. One or more process gases provided from the gas panel 110 may supply reactive species through the showerhead 112 into the interior processing region 107. The showerhead 112 also functions as an electrode for coupling power to gases within the interior processing region 107, for example, for generating ionized species from the gases. It is contemplated that power may be coupled to the gases within the interior processing region 107 utilizing other electrodes or devices.

A power supply 113 may be coupled through a match circuit 114 to the showerhead 112. In one example, the power supply 113 may supply high frequency RF energy to the showerhead 112. The energy applied to the showerhead 112 from the power supply 113 is inductively coupled to the process gases disposed in the interior processing region 107 to maintain a plasma region in the processing chamber 100. Alternatively, or in addition to the power supply 113, power may be capacitively coupled to the process gases in the processing region 107 to maintain the plasma within the processing region 107. The operation of the power supply 113 may be controlled by a controller, (not shown), that also controls the operation of other components in the processing chamber 100.

Figure 1B:
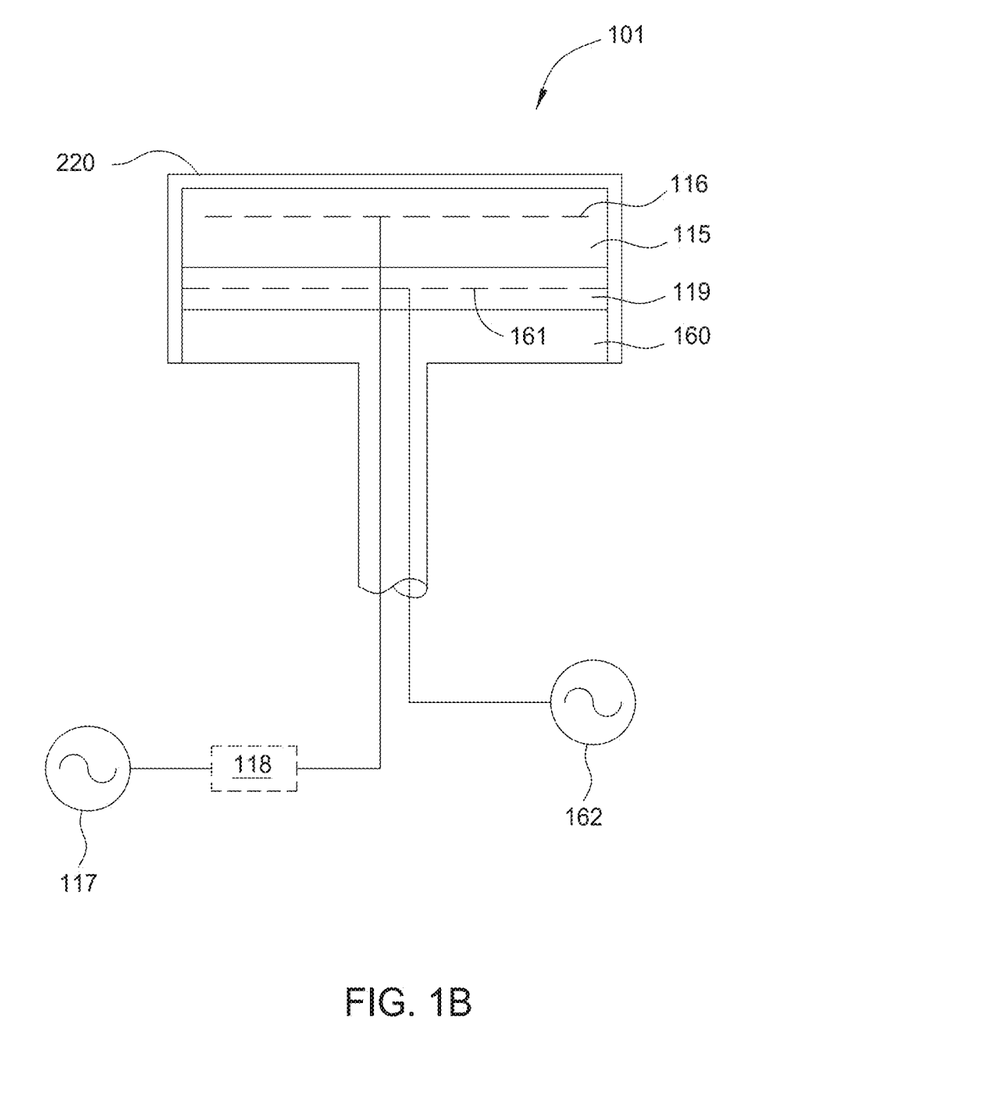
FIG. 1B is an enlarged partial view of the substrate support assembly of the processing chamber of FIG. 1A.

FIG. 1B is an enlarged partial view of the substrate support assembly 101 of the processing chamber 100 of FIG. 1A. The substrate support assembly 101 includes an electrostatic chuck (ESC) 115 for chucking the substrate 102 disposed thereon. The ESC 115 secures the substrate 102 to the substrate support assembly 101 during processing. The ESC 115 may be formed from a dielectric material, for example a ceramic material, such as aluminum nitride (AlN) among other suitable materials. The ESC 115 uses the electrostatic attraction to hold the substrate 102 to the substrate support assembly 101.

The ESC 115 includes a chucking electrode 116 connected to a power source 117 through an isolation transformer 118 disposed between the power source 117 and the chucking electrode 116. The isolation transformer 118 may optionally be part of the power source 117. The power source 117 may apply a chucking voltage between about 50 Volts and about 5000 Volts to the chucking electrode 116. Optionally, the substrate support assembly 101 may include one or more of a heater 119 having a heating element 161 coupled to a power supply 162, a cooling base (not shown) or a facility plate 160. The ESC 115 may have a coating or layer disposed thereon configured to inhibit current leakage and reduce particle contamination within the processing chamber 100. In one example, the coating or layer is a seasoning layer 220.

In an alternative embodiment, an RF filtering circuit may be used in addition to or as an alternative to the isolation transformer 118. The RF filtering circuit may be tuned to block out any parasitic RF components that may interfere with the power source 117, thus maximizing the chucking ability of the ESC 115. In one example, the RF filtering circuit may include a 50 nF inductor which filters out HFRF at approximately 13.56 MHz.

In one example, the ESC 115 may be a Johnsen-Rahbeck (JR) mono-polar chuck which utilizes JR forces rather than Coulombic forces to chuck a substrate. When utilizing JR forces, chucking force increases with an increase in contact area and/or an increase in effective voltage (e.g., increased power supply and/or reduced leakage current). As described below, seasoning layers can affect the leakage current, and thus, can affect the chucking ability of an ESC.

Figure 2:
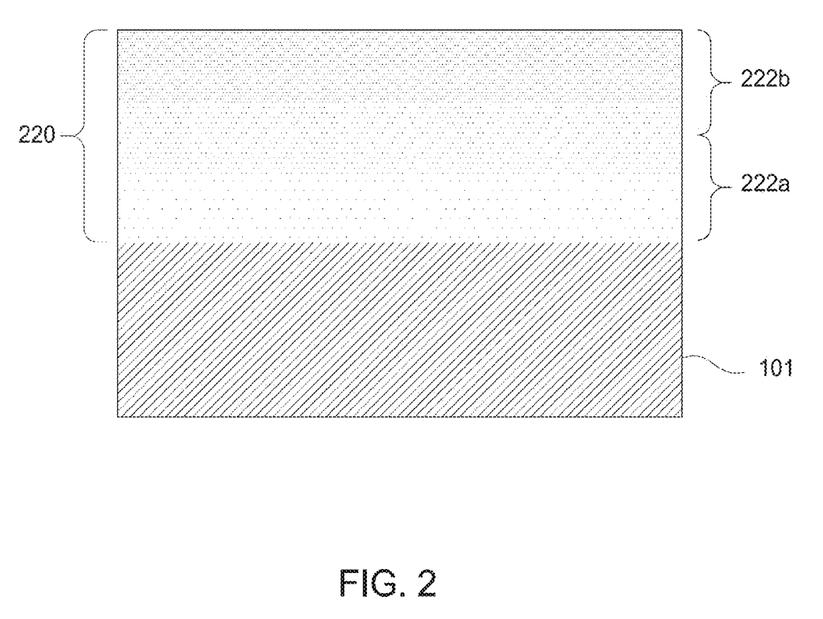
FIG. 2 illustrates a sectional view of a seasoning layer, according to one embodiment of the disclosure.

FIG. 2 illustrates a sectional view of a seasoning layer 220, according to one embodiment of the disclosure. The seasoning layer 220 is illustrated disposed on a substrate support assembly 101. It is to be understood, however, that the seasoning layer 220 may be disposed on other internal surfaces of a processing chamber. The seasoning layer 220 is a graded seasoning layer having a graded or tapered concentration of one or more elements.

In one example, the seasoning layer 220 has a graded concentration of boron. In such an example, the seasoning layer 220 has a greater concentration at a base portion 222a of the seasoning layer 220 than at a top portion 222b of the seasoning layer 220. While the seasoning layer 220 is shown in FIG. 2 as having multiple sub-layers, it is to be understood that seasoning layer 220 is a single layer with a graded composition that is continuously formed. The seasoning 220 may be a boron-carbon-nitrogen film having a composition of nitrogen within a range of about 1 mole percent (mol %) to 10 mol %, carbon within a range of about 20 mol % to about 50 mol %, and boron within a range of about 80 mol % to about 90 mol % at the base portion 222a to zero at the top portion 222b. In one implementation, it is contemplated that the seasoning layer 220 may have a relatively constant boron concentration in the base portion 222a before beginning to taper the boron concentration to zero in the top portion 222b. In such an embodiment, the base portion 222a may have a thickness of about 100 angstroms to about 2,000 angstroms with a uniform concentration of boron, such as about 85 mol % to about 95 mol %. After depositing the base portion 222a, the concentration of boron may taper downward to zero while continuing to deposit a carbon-boron-nitride film having a total thickness within a range of about 200 angstroms to about 20,000 angstroms, such as about 200 angstroms to about 4,000 angstroms.

Figure 3:
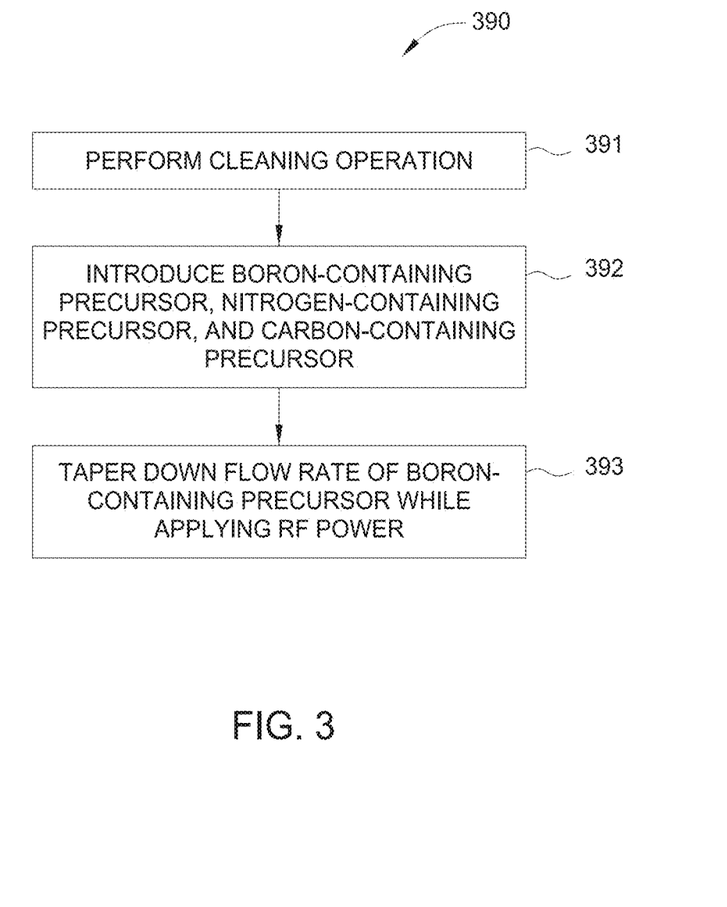
FIG. 3 is a flow a diagram of a method for depositing a seasoning layer, according to one embodiment of the disclosure.

FIG. 3 is a flow a diagram of a method 390 for depositing a seasoning layer, according to one embodiment of the disclosure. The method 390 begins at operation 391. In operation 391, a cleaning operation is performed. The cleaning operation is performed within a processing chamber, such a processing chamber 100, after an etch process, deposition process, or other process. The cleaning process removes any particle contaminants or previously-deposited chamber seasonings from the internal surfaces of the processing chamber. Suitable cleaning gases may include one or more of $O_2$, Ar, or $NF_3$, or radicals or ions thereof.

After evacuation of the cleaning gases, one or more precursor gases are introduced into the processing chamber during operation 392 to deposit the base portion 222a (shown in FIG. 2) of the seasoning layer 220. The one or more precursor gases introduce boron, carbon, and nitrogen to the processing chamber. The one or more precursor gases may include a carbon-containing precursor, a nitrogen-containing precursor, and a boron-containing precursor. The one or more precursor gases may be introduced to the processing chamber through the same or different gas inlets.

Example carbon-containing precursors include propylene, acetylene, ethylene, methane, hexane, isoprene, and butadiene, among others. The carbon-containing precursor gas may be introduced into the process chamber at a flow rate within a range of about 100 sccm to about 2,000 sccm. Example nitrogen-containing precursors include pyridine, aliphatic amines, amines, nitriles, and ammonia, among others. The nitrogen-containing precursor gas may be introduced into the process chamber at a flow rate within a range of about 500 sccm to about 15,000 sccm. The boron-containing precursor may be initially introduced into the processing chamber at a flow rate within a range of about 500 sccm to about 4,000 sccm. Example boron-containing precursors include diborane, orthocarborane, and trimethylborazine, among others. During operation 392, a first portion of the seasoning layer 220 is formed. The first portion of the seasoning layer 220 is an amorphous boron film. The amorphous boron film is formed during a thermal decomposition of the precursor gases. Because the boron-containing precursor dissociates much more easily than the carbon-containing and nitrogen-containing precursors, the amorphous boron film formed during operation 392 may be about 80 mol % to about 100 mol % boron, such as about 80 mol % to about 90 mol %.

Figure 4A:
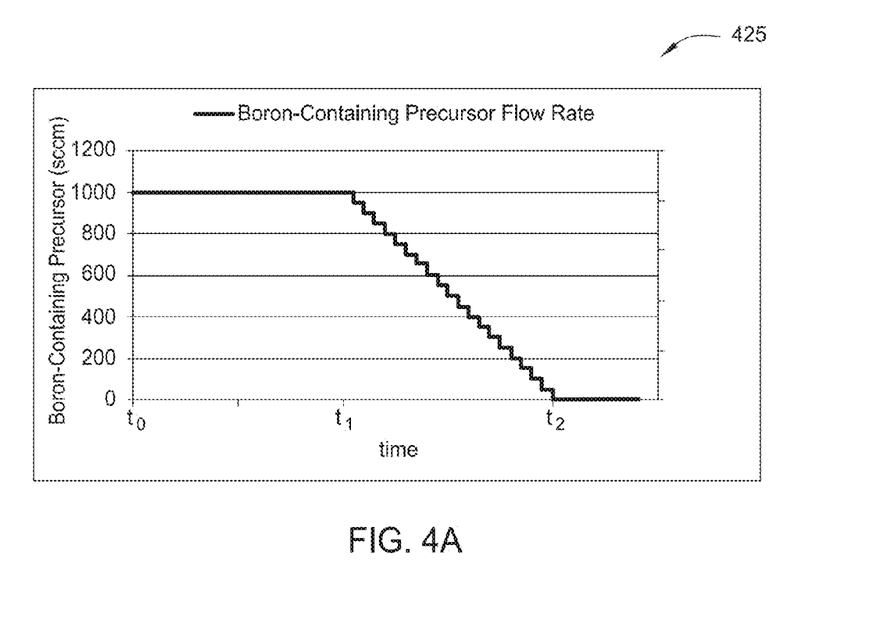
FIG. 4A illustrates a graph of a flow rate of a boron-containing precursor gas during deposition of a seasoning layer, according to one embodiment of the disclosure.
Figure 4B:
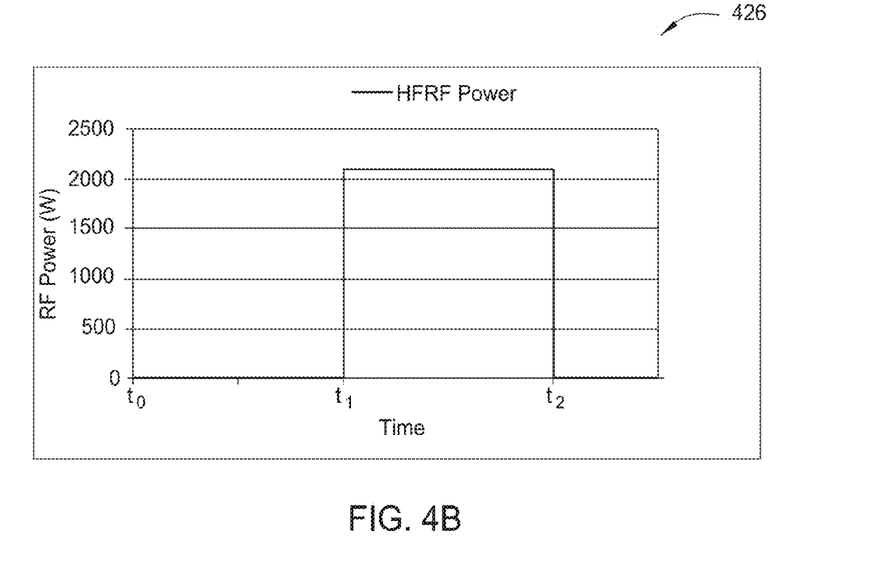
FIG. 4B illustrates a graph of the application of RF power during deposition of a seasoning layer, according to one embodiment of the disclosure.

In operation 393, the flow rate of the boron-containing precursor is decreased, and RF power is applied. The boron-containing precursor may be initially introduced into the processing chamber at a flow rate within a range of about 500 sccm to about 4,000 sccm, and may be tapered down to a flow rate of about zero. During the deposition of the seasoning layer 220, the flow rates of the carbon-containing precursor and the nitrogen-containing precursor may remain about constant, while the flow rate of the boron-containing precursor may be decreased during formation of the seasoning layer 220. Simultaneously with the tapering of the boron-containing precursor, RF power is applied to ionize the precursor gases. Because the RF power facilitates ionization of the nitrogen-containing precursor and the carbon-containing precursor, the portion of the seasoning layer 220 formed during operation 393 (e.g., the top portion 222b shown in FIG. 2) includes a higher concentration of nitrogen and carbon than does the portion of the seasoning layer 220 formed during operation 392 (e.g., the base portion 222a). FIGS. 4A and 4B illustrate examples of boron-containing precursor flow rates and RF power application, respectively, for method 390.

FIG. 4A illustrates a graph 425 of a flow rate of a boron-containing precursor gas during deposition of a seasoning layer, according to one embodiment of the disclosure. At time $t_0$, a boron-containing precursor gas is introduced into a processing chamber at a constant flow rate within a range of 500 sccm to about 4,000 sccm. In the example shown in FIG. 4A, the boron-containing precursor is introduced at 1,000 sccm. At time $t_1$, which may be in a range of about 5 seconds to about 30 seconds from time $t_0$, the flow rate of the boron-containing precursor gas begins to taper off or decrease. In one example, time $t_1$ may coincide with operation 393 shown in FIG. 3. The flow rate of the boron-containing precursor is continuously decreased until time $t_2$, at which time the flow rate of the boron-containing precursor gas reaches zero. In one example, the difference between time $t_1$ and time $t_2$ is about 10 seconds to about 20 seconds. The difference between time $t_1$ and $t_2$ is selected to provide a sufficient amount of boron in the seasoning layer 220 to reduce flaking of the seasoning layer 220, and to provide a sufficient amount of amorphous carbon to facilitate charge trapping of the seasoning layer 220. Charge trapping within the seasoning layer 220 improves the electrostatic chucking performance of electrostatic chucks having the seasoning layer 220 thereon.

FIG. 4B illustrates a graph 426 of the application of high frequency RF power during deposition of a seasoning layer, according to one embodiment of the disclosure. RF power may be applied to the processing chamber to ionize one or more gases within the processing chamber. In one example, no RF power is applied to the processing chamber between time $t_0$ and time $t_1$. The absence of RF power relies upon thermal decomposition of the precursor gases to initially deposit the seasoning layer. Thermal decomposition of the precursor gases facilitates adhesion of a seasoning layer to an underlying chamber component. At time $t_1$, coinciding with the tapering of the boron-containing precursor gas, RF power at a constant level is applied to the processing chamber. The application of RF power ionizes the one or more precursor gases to facilitate the formation of amorphous material within the seasoning layer 220. The boron-containing precursor gas is easily decomposed with thermal energy, however, the carbon-containing and nitrogen-containing precursor gases may not decompose as easily. The applied RF power facilitates decomposition of the carbon-containing and nitrogen-containing precursors. RF power application continues to time $t_2$, at which time the deposition of the seasoning layer 220 is concluded.

Figure 5:
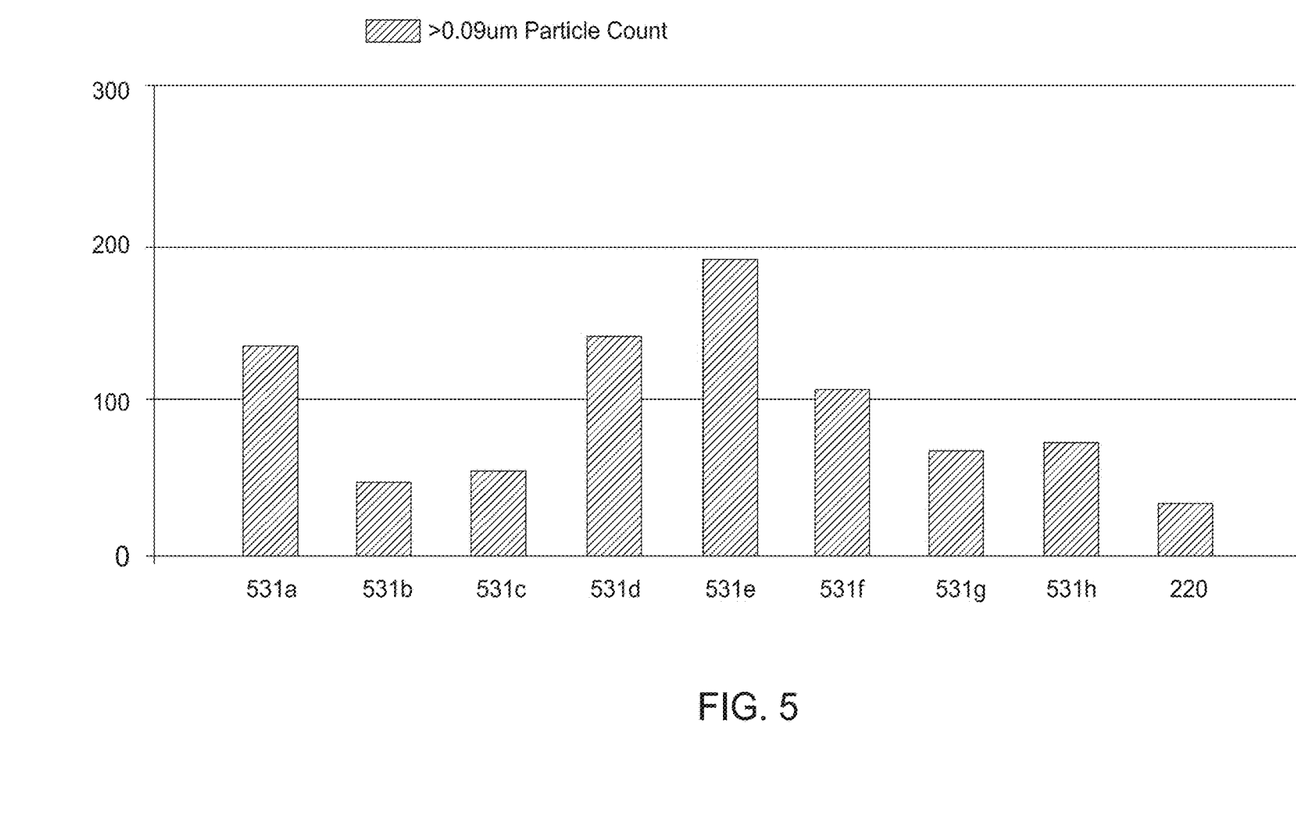
FIG. 5 comparatively illustrates the particle performance of a seasoning layer of the present disclosure versus conventional seasoning layers.

FIG. 5 is a graph 530 comparatively illustrating the particle performance of a seasoning layer 220 of the present disclosure versus conventional seasoning layers. Graph 530 illustrates the number of undesired particles having a size greater than 0.09 micrometers found on a 300 mm silicon substrate after performing a process on the substrate. The process may be, for example, an etch process, and performed in the presence of each of the seasoning layers 531a-531h and 220 for comparative purposes. The seasoning layer 531a is a nitrogen-doped amorphous carbon layer that is substantially free of boron. The seasoning layer 531a resulted in a particle count of about 130 particles on the surface of the substrate after processing.

The seasoning layer 531b is an amorphous boron layer. The seasoning layer 531b resulted in a particle count of about 45 particles on the surface of the substrate after processing. The seasoning layer 531c is a stacked seasoning layer having a first layer of amorphous boron, and a second layer of nitrogen-doped amorphous carbon disposed on the first layer. The seasoning layer 531c resulted in a particle count of about 50 particles on the surface of the substrate after processing. The seasoning layer 531d is a boron-doped amorphous carbon layer having a uniform concentration of boron throughout. In one example, the composition of the seasoning layer 531d is about 50 mol % boron. The seasoning layer 531d resulted in a particle count of about 140 particles on the surface of the substrate after processing.

The seasoning layer 531e is an amorphous carbon layer which may be formed with a nitrogen precursor flow set point within a range of about 500-1000 sccm and a boron precursor flow set point within a range of about 1000-2000 sccm. The seasoning layer 531e resulted in a particle count of about 190 particles on the surface of the substrate after processing. The seasoning layer 531f is an amorphous carbon layer formed using a nitrogen precursor flow set point within a range of about 5,000-10,000 sccm and a boron precursor flow set point within a range of about 1,000-2,000 sccm. Thus, the seasoning layer 531f has a greater nitrogen concentration than the seasoning layer 531e. The seasoning layer 531f resulted in a particle count of about 105 particles on the surface of the substrate after processing. The seasoning layer 531g is an amorphous carbon layer formed using a nitrogen precursor flow set point within a range of about 5,000-10,000 sccm and a boron precursor flow set point within a range of about 500-1,000 sccm. Thus, the seasoning layer 531g has a lower boron concentration than the seasoning layer 531f. The seasoning layer 531g resulted in a particle count of about 70 particles on the surface of the substrate after processing.

The seasoning layer 531h is an amorphous carbon layer formed using a nitrogen precursor flow set point within a range of about 5,000-10,000 sccm and boron flow set point which begins within a range of about 500-1,000 sccm and tapers to 200 sccm. The seasoning layer 531h may be formed using the boron gas flow profile of FIG. 4A. The seasoning layer 531h resulted in a particle count of about 80 particles on the surface of the substrate after processing. The seasoning layer 220 is formed as described above. The seasoning layer 220 is an amorphous carbon film formed using a nitrogen flow set point within a range of about 5,000-10,000 sccm and a boron flow set point which begins at about 500-1000 sccm and tapers to zero. The seasoning layer 531h resulted in a particle count of about 35 particles on the surface of the substrate after processing. For further comparison, in the absence of a seasoning layer, a processed substrate will have a particle count in excess of 250.

Figure 6A:
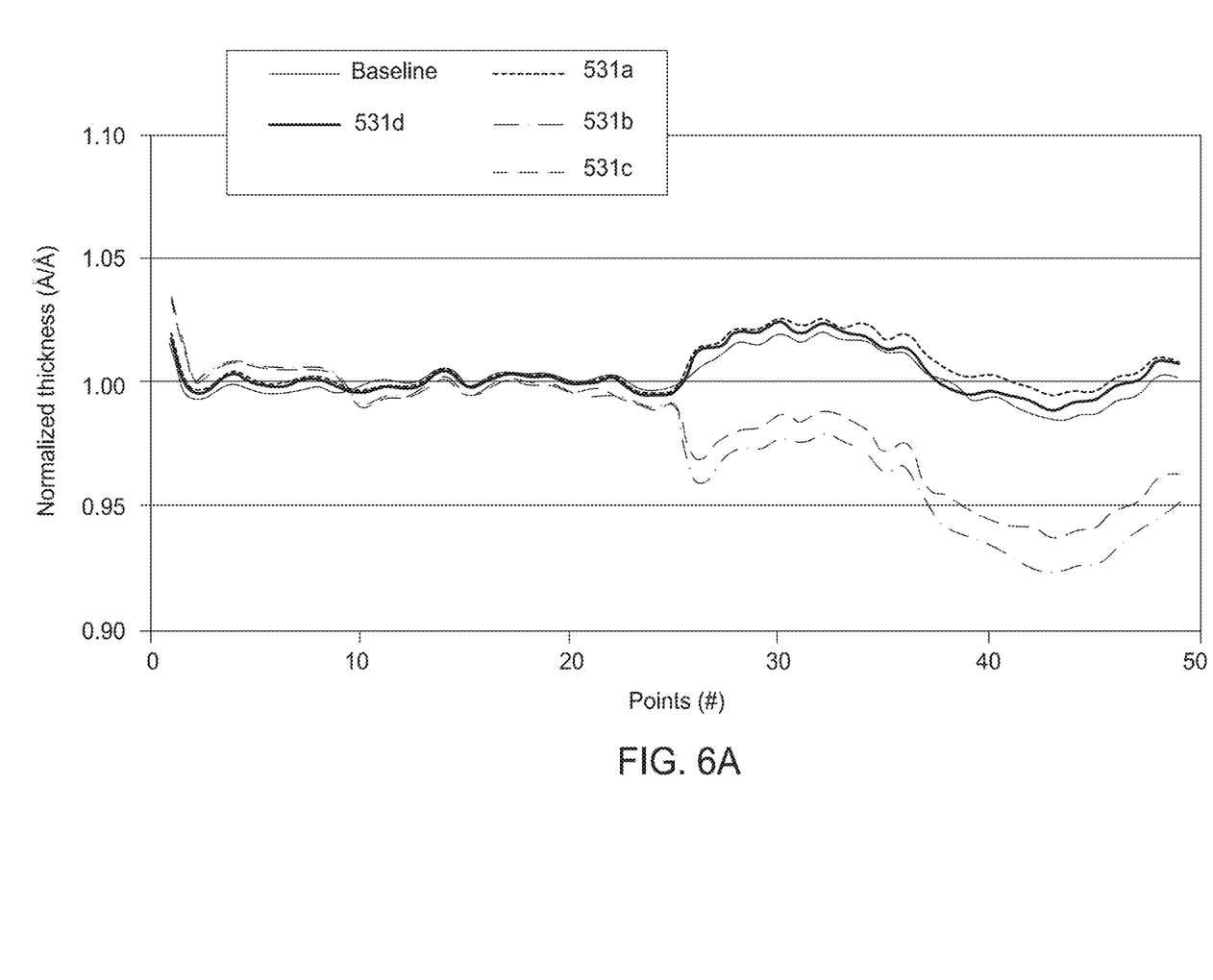
FIGS. 6A and 6B comparatively illustrate chucking performance of a seasoning layer of the present disclosure versus conventional seasoning layers.
Figure 6B:
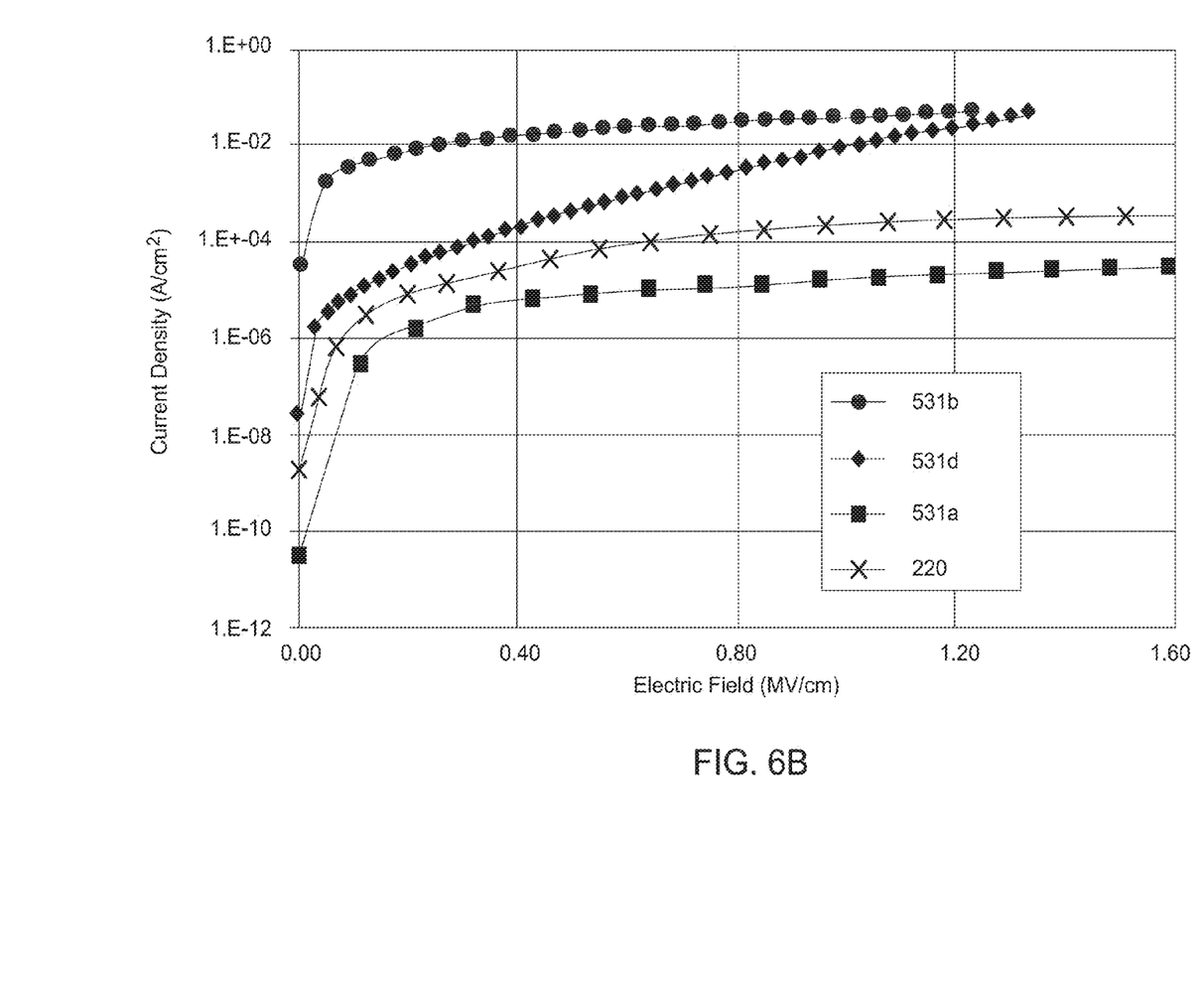

FIGS. 6A and 6B comparatively illustrate chucking performance of a seasoning layer of the present disclosure versus conventional seasoning layers. FIG. 6A illustrates the normalized thickness of substrates (thickness of a planar substrate measured from a reference point versus thickness of a chucked substrate from the reference point) for 49 equal space radial points across the substrate. The "baseline" illustrates a thickness profile of a planar substrate chucked on a support. Therefore, substrates that are fully chucked will have a thickness profile which matches the baseline profile. As illustrated in FIG. 6A, each of the seasoning layers 531a and 531d result in planar chucking of the substrate. The graph for seasoning layer 220 is similar, although not shown. However, while each of the seasoning layers 531a and 531d result in complete chucking of a substrate, each of the seasoning layers 531a and 531d result in unsatisfactorily high particle counts on processed substrates, as shown in FIG. 5. Each of the seasoning layers 531b and 531c have normalized thickness profiles illustrating a concave curve of a substrate, indicating a partially-chucked substrate.

FIG. 6B illustrates the leakage current of the seasoning layer 220 of the present disclosure versus the leakage current of conventional seasoning layers, 531a, 531b, and 531d. As illustrated, the leakage current of the seasoning layer 220 is significantly less than the leakage current of conventional seasoning layers 531b and 531d. Additionally, the leakage current of the seasoning layer 220 is within a magnitude of 10 of the conventional seasoning layer 531a, while providing significantly better particle performance than the conventional seasoning layer 531a, as shown in FIG. 5. Thus, the seasoning layer 220 is able to provide charge trapping or chucking performance about equal to the conventional seasoning layers, while significantly reducing particle contamination on processed substrates.

Figure 7A:
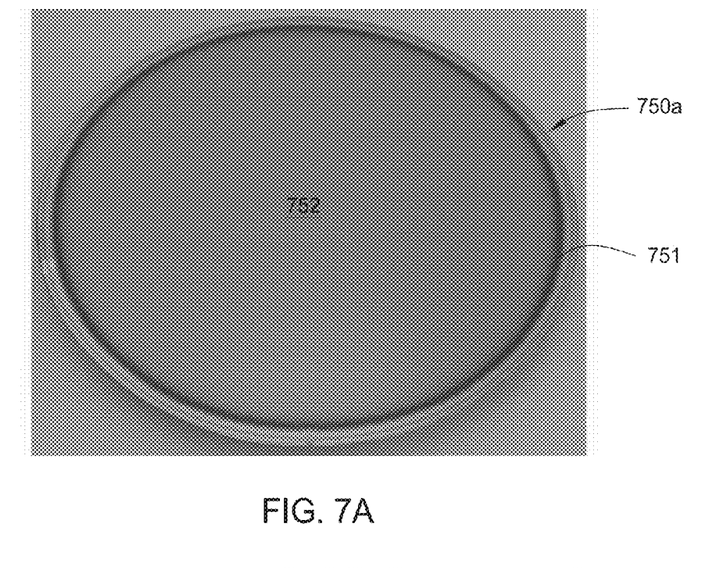
FIG. 7A illustrates a substrate processed in a processing chamber seasoned with a conventional seasoning layer. FIG.
Figure 7B:
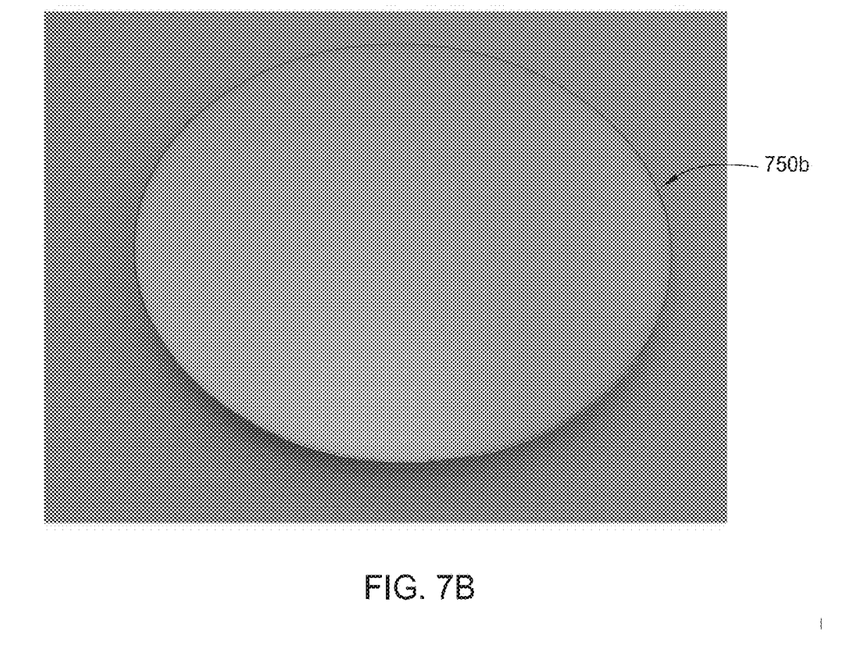

FIG. 7A illustrates a substrate 750a processed in a processing chamber seasoned with a conventional seasoning layer. FIG. 7B illustrates a substrate 750b processed in a processing chamber seasoned with a seasoning layer of the present disclosure. The substrate 750a exhibits a deposition ring 751 on a back surface 752 thereof. The deposition ring 751 occurs due to concave bowing of the substrate 750a during processing, resulting from the inability of an electrostatic chuck to secure the substrate 750a in a planar configuration. In particular, because portions of the back surface 752 of the substrate 750a are exposed during processing, material is able to deposit on the back surface 752. As described above, conventional seasoning layers often have inadequate charge trapping abilities (e.g., increased current leakage) which negatively effects the electrostatic chucking performing of a chuck coated with conventional seasoning layers. The decreased chucking performance results in portions of the back surface 752 of a substrate 750a being exposed during processing. The presence of the deposition ring 751 negatively effects device performance, and in some cases, may result in a total loss of the substrate 750a.

In contrast, the substrate 750b in FIG. 7B was processed in a processing chamber seasoned with the seasoning layer 220 of the present disclosure. The seasoning layer 220 facilitates improved chucking performance via improved charge trapping compared to conventional seasoning layers, even at temperatures in a range of about 300 degrees Celsius to about 650 degrees Celsius. Thus, the substrate 750b, even with a bow of up to +/−400 micrometers, can be chucked and maintained in a planar configuration during processing. Because the substrate 750b is planar during processing, the substrate 750b does not develop a deposition ring on the back surface thereof.

Benefits of the disclosed seasoning layers include reduced particle contamination on substrates and improved charge trapping (e.g., reduced current leakage). The disclosed seasoning layers include tapered boron concentration profiles. A relatively higher boron concentration near a base of the seasoning layer facilities increased adhesion to chamber components, such as those made of aluminum oxide or aluminum nitride. The increased adhesion of the disclosed seasoning layers results in reduced particle contamination due to reduced flaking of the seasoning layer. The relatively lower concentration of boron near the top portion of the seasoning layer results in increased charge trapping. Thus, the leakage current of the disclosed seasoning layer is decreased and chucking performance of a substrate support seasoned with the disclosed seasoning layer is improved.

While the foregoing is directed to embodiments of the present disclosure, other and further embodiments of the disclosure may be devised without departing from the basic scope thereof, and the scope thereof is determined by the claims that follow.

What is claimed is:

1. A method of depositing a seasoning layer, comprising:
    introducing a boron precursor, a nitrogen precursor, and a carbon precursor into a processing chamber for a first time period;
    forming an amorphous boron base portion of a boron-carbon-nitrogen seasoning layer during the first time period;
    tapering the flow rate of the boron precursor during a second time period; and
    depositing a top portion of the boron-carbon-nitrogen seasoning layer on the base portion during the second time period, the top portion having a tapered boron concentration profile.

2. The method of claim 1, wherein the boron precursor, the nitrogen precursor, and the carbon precursor are thermally decomposed during the first time period.

3. The method of claim 1, further comprising applying RF power to the processing chamber to ionize the boron precursor, the nitrogen precursor, and the carbon precursor.

4. The method of claim 3, wherein the RF power is applied during the second time period.

5. The method of claim 1, wherein the first time period is within a range of about 5 seconds to about 30 seconds.

6. The method of claim 1, wherein the second time period is within a range of about 10 seconds to about 20 seconds.

7. The method of claim 1, further comprising introducing a cleaning gas into the processing chamber prior to introducing the boron precursor, the nitrogen precursor, and the carbon precursor into a processing chamber, wherein the cleaning gas comprises one or more of $O_2$, Ar, and $NF_3$.

8. The method of claim 1, wherein the boron precursor is selected from a group consisting of diborane, orthocarborane, and trimethylborazine.

9. The method of claim 1, wherein the nitrogen precursor is selected from the group consisting of pyridine, aliphatic amines, amines, nitriles, and ammonia.

10. The method of claim 1, wherein the carbon precursor is selected from the group consisting of propylene, acetylene, ethylene, methane, hexane, isoprene, and butadiene.

11. The method of claim 1, wherein the boron-carbon-nitrogen seasoning layer is deposited to a thickness of about 200 angstroms to about 2,000 angstroms.

12. A method of chucking a substrate, comprising:
    forming a seasoning layer within a process chamber, comprising:
        introducing a boron precursor, a nitrogen precursor, and a carbon precursor into a processing chamber for a first time period;
        forming an amorphous boron base portion of a boron-carbon-nitrogen seasoning layer during the first time period;
        tapering the flow rate of the boron precursor during a second time period; and
        depositing a top portion of the boron-carbon-nitrogen seasoning layer on the base portion during the second time period, the top portion having a tapered boron concentration profile;
    positioning a substrate on a support including an electrostatic chuck within the processing chamber; and
    applying power to the support to electrostatically chuck the substrate to the support.

13. The method of claim 12, wherein the substrate is a 300 mm silicon wafer and has a bow of about +/−400 micrometers prior to applying power to the support, and is about planar after the applying power to the support.

14. The method of claim 12, wherein the boron-carbon-nitrogen seasoning layer is deposited to a thickness of about 200 angstroms to about 2,000 angstroms.

15. The method of claim 14, wherein the substrate is at a temperature of about 300 degrees Celsius to about 650 degrees Celsius when electrostatically chucked to the support.

16. The method of claim 14, wherein the applying power to the support comprises filtering parasitic RF power using an inductor.

17. The method of claim 14, wherein the carbon precursor is selected from the group consisting of propylene, acetylene, ethylene, methane, hexane, isoprene, and butadiene.

18. A seasoning layer, comprising:
    a boron-carbon-nitrogen film, wherein the boron-carbon-nitrogen film has a base portion with a uniform boron concentration, and a top portion with a tapered boron concentration.

19. The seasoning layer of claim 18, wherein the boron-carbon-nitrogen film comprises amorphous carbon.

20. The seasoning layer of claim 19, wherein the tapered boron concentration decreases from the base portion to a top surface of the film.

* * * * *